(12) United States Patent
Stryker

(10) Patent No.: US 10,692,668 B2
(45) Date of Patent: Jun. 23, 2020

(54) FORCE FEEDBACK SURFACE FOR AN ELECTRONIC DEVICE

(71) Applicant: Apple Inc., Cupertino, CA (US)

(72) Inventor: James A. Stryker, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 47 days.

(21) Appl. No.: 15/215,448

(22) Filed: Jul. 20, 2016

(65) Prior Publication Data

US 2017/0076885 A1 Mar. 16, 2017

Related U.S. Application Data

(60) Provisional application No. 62/219,618, filed on Sep. 16, 2015.

(51) Int. Cl.
*G06F 3/041* (2006.01)
*H01H 13/85* (2006.01)
(Continued)

(52) U.S. Cl.
CPC ............. *H01H 13/85* (2013.01); *G06F 3/016* (2013.01); *G06F 3/0416* (2013.01); *H01H 13/7065* (2013.01); *H03K 17/9622* (2013.01); *G06F 2203/04809* (2013.01); *H01H 13/704* (2013.01); *H01H 13/88* (2013.01); *H01H 2215/00* (2013.01); *H01H 2215/05* (2013.01); *H01H 2221/04* (2013.01); *H03K 2217/96062* (2013.01)

(58) Field of Classification Search
CPC .... H01F 7/064; H01H 13/85; H01H 13/7065; H01H 13/704; H01H 13/88; H01H 2215/00; H01H 2221/04; H01H 2215/05; H03K 17/9622; H03K 2217/96062; G06F 3/0416; G06F 3/016; G06F 2203/04809; G06F 3/041

See application file for complete search history.

(56) References Cited

U.S. PATENT DOCUMENTS

2002/0149561 A1* 10/2002 Fukumoto .......... G01C 21/3664
345/156
2003/0184574 A1 10/2003 Phillips et al.
(Continued)

FOREIGN PATENT DOCUMENTS

CN 103207672 A * 7/2013 ........... G06F 3/0202

*Primary Examiner* — Jeff Piziali

(57) ABSTRACT

An accessory device having a first and second body is described. The second body may include a force feedback mechanism that responds to an input received at the first body causing a force feedback. The force feedback mechanism includes coils distributed throughout the second body, with each coil configured to receive an electrical current such that each coil provides an external magnetic field to magnetically couple with one or more magnets disposed in the first body, causing the first body to move in a direction toward the second body. The first body may return to its original position when the external magnetic field is no longer applied. In this regard, the movement of the first body defines the force feedback. Also, the first body may include a keyboard or a touch screen functioning with the force feedback mechanism. The accessory device may be used in conjunction with an electronic device.

10 Claims, 13 Drawing Sheets

(51) Int. Cl.
*H01H 13/7065* (2006.01)
*H03K 17/96* (2006.01)
*G06F 3/01* (2006.01)
*H01H 13/704* (2006.01)
*H01H 13/88* (2006.01)

(56) References Cited

U.S. PATENT DOCUMENTS

| | | | | |
|---|---|---|---|---|
| 2005/0038944 A1* | 2/2005 | Harada | | G06F 3/016 710/110 |
| 2006/0109254 A1* | 5/2006 | Akieda | | G06F 3/016 345/173 |
| 2006/0143342 A1* | 6/2006 | Kim | | G06F 3/016 710/73 |
| 2008/0251364 A1* | 10/2008 | Takala | | G06F 3/01 200/341 |
| 2008/0316180 A1 | 12/2008 | Carmody et al. | | |
| 2009/0167704 A1 | 7/2009 | Terlizzi et al. | | |
| 2010/0302199 A1* | 12/2010 | Taylor | | G06F 3/046 345/174 |
| 2011/0193787 A1* | 8/2011 | Morishige | | G06F 3/016 345/173 |
| 2011/0234498 A1* | 9/2011 | Gray | | G06F 3/016 345/168 |
| 2014/0176478 A1* | 6/2014 | Kern | | G06F 3/016 345/173 |
| 2014/0197938 A1* | 7/2014 | Kern | | G06F 3/016 340/407.2 |
| 2014/0218324 A1* | 8/2014 | Tissot | | B60K 37/06 345/173 |
| 2015/0122621 A1* | 5/2015 | Fukumoto | | H03K 17/9622 200/5 A |
| 2016/0011684 A1* | 1/2016 | Zhang | | G06F 3/0202 345/173 |

\* cited by examiner

FORCE FEEDBACK SURFACE FOR AN ELECTRONIC DEVICE

CROSS-REFERENCE TO RELATED APPLICATION(S)

This application claims the benefit of priority under 35 U.S.C. § 119(e) to U.S. Provisional Application No. 62/219,618, filed on Sep. 16, 2015, and titled "FORCE FEEDBACK SURFACE FOR AN ELECTRONIC DEVICE," the disclosure of which is incorporated herein by reference in its entirety.

FIELD

The following description relates to an accessory device that may be used in conjunction with an electronic device. In particular, the following description relates to an accessory device having a force feedback surface designed to provide a force feedback to user. The force feedback may be in the form of a movement, vibration or other motion in response to the user generating an input to the force feedback surface.

BACKGROUND

Accessory devices may be used with certain electronic devices. An accessory device may be used to provide a protective layer for the electronic device. Some accessory device may respond to a user to control an electronic device.

SUMMARY

In one aspect, an accessory device suitable for use with an electronic device is described. The accessory device may include a first body that includes a touch sensitive layer embedded in the first body and configured to receive a touch input. The accessory device may further include a second body separate from the first body. The second body may include a force feedback mechanism that provides a force feedback at the first body in response to the touch input.

In another aspect, an accessory device is described. The accessory device may include a substrate that includes an opening. The accessory device may further include a first body configured to receive a touch input. The first body may also include a first magnet. The accessory device may further include a second body disposed in the opening. The second body may include a force feedback mechanism configured to provide a force feedback at the first body based upon the touch input. The second body may further include a second magnet having a first magnetic polarity configured to magnetically couple with the first magnet to drive the first body toward the second body and place the first body within the opening. The second body may further include a third magnet having a second magnetic polarity opposite the first magnetic polarity. The third magnet can be configured to magnetically repel the first magnet to drive the first body away from the second body and place the first body at least partially outside the opening.

In another aspect, a method for assembling an accessory device that provides a force feedback in the accessory device is described. The method may include forming a first body that includes a touch sensitive layer embedded in the first body and configured to receive a touch input. The method may further include forming a second body separate from the first body. The second body may include a force feedback mechanism that provides a force feedback at the first body in response to the touch input.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
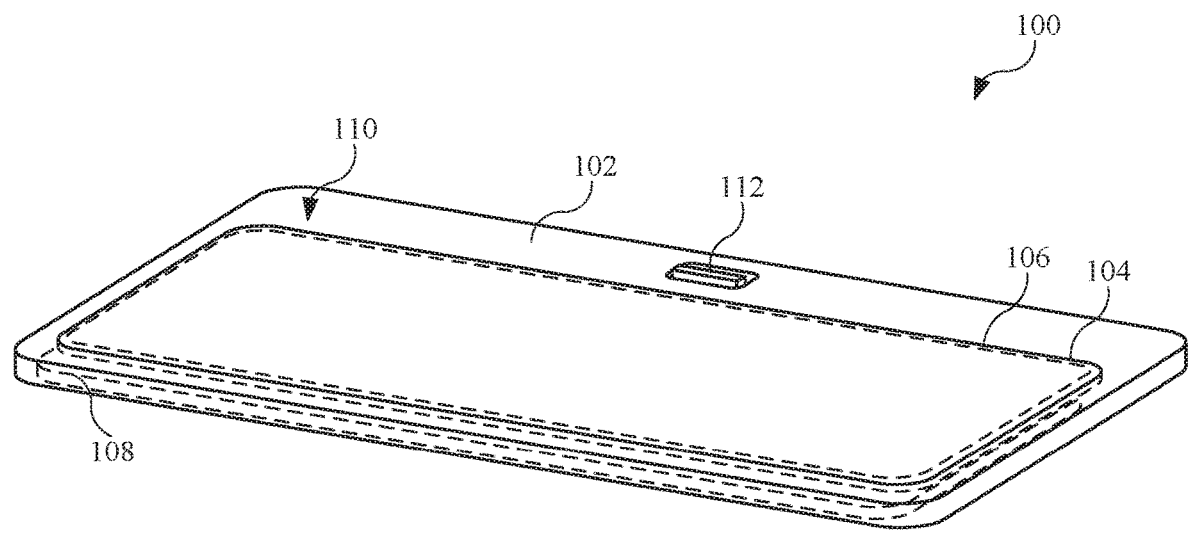
FIG. 1 illustrates an isometric view of an embodiment of an accessory device in a closed configuration, in accordance with the described embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to an accessory device that may be used with an electronic device. In particular, the accessory device may include one or more features designed to provide feedback to a user of the accessory device when the user interacts with the accessory device. The feedback may take the form of, for example, a "click" action similar in feel to a tactile feedback keyboard, or a vibrational event similar to a motor actuating a part. However, rather using mechanical features and motors, the accessory device uses several magnets, and in particular, a change in magnetic polarity of one or more magnets, causing the magnets to magnetically couple or repel with another magnet, based on the magnetic polarity of the magnets. The magnetic coupling and repelling can provide a driving force that actuates the magnets, which in turn actuates a structural component of the accessory device carrying the magnets. The movement of the structural component can be felt or sensed by the user.

The accessory device may include a first body and a second body. The first body may include an input feature capable of receiving a touch input, such as a touch sensitive layer, a keyboard assembly, and/or a display assembly. The second body may be positioned at least partially behind the first body to reveal the input feature(s). Both the first body and the second body may include several magnets embedded and distributed throughout various regions.

The accessory device is designed to allow the second body to move with respect to the first body, and accordingly, magnets in the second body can move with respect to the magnets in the first body. In one configuration, the second body is aligned with the first body such that each of the first body magnets are magnetically coupled with at least one second body magnet, and the first body is pulled toward the second body by the magnetic attraction forces between the magnets. In this regard, the accessory device may include an opening to receive the first body and place the accessory device in a closed configuration. Alternatively, the second body can shift relative to the first body such that none of the first body magnets are magnetically coupled with the second body magnets. Moreover, the magnets in the second body may include a magnetic pole (such as a "North Pole") aligned with magnets in the first body having the same magnetic pole, and the first body is driven away from the second body by the magnetic repulsive forces between the magnets of like magnetic polarity. In this regard, the first body is lifted from, and at least partially above, the opening to place the accessory device in an open configuration.

In the open configuration, the accessory device may be designed to allow a user of the accessory device to trigger the force feedback that may be felt or sensed by the user. The force feedback mechanism may include several coils distributed throughout the second body. Further, the coils may surround the aforementioned magnets. The coils may be formed from a metal wire (such as copper wire) wrapped in a coil-like manner. Alternatively, the coils may be printed onto a circuit board by in a spiral-like manner resembling a coil. The first body may include a touch sensitive layer capable of detecting a touch input from the user. When contacted by the user, the touch sensitive layer may provide an input to a controller indicating a location the touch input to the first body. The controller then sends a command to send electrical current through the coil in a location corresponding to a location of the touch input. As a result, the coil forms an electromagnet having an external electromagnetic field with a magnetic polarity that magnetically attracts with a first body magnet (or magnets) located in a region corresponding to the touch input. The magnetic attraction drives a portion of the first body in a direction toward the second body. The movement of the first body with respect to the second body in this manner may define the force feedback felt by the user.

The electrical current passing through the coil may vary in order define different types of force feedback. For example, a short, single pulse of electrical current through the coil may create a feel or sensation, to the user, of a button press. Further, when the first body includes a key (such as a key of a keyboard assembly), a user touching or pressing the key may actuate the key rather than the first body, creating a feel or sensation, to the user, of a keystroke that occurs in a tactile keyboard. Also, the electrical current may be provided as alternating electrical current pulses having short, frequent pulses, causing the magnetic polarity to alternate in accordance with the alternating current pulses. Based on the alternating magnetic polarity, a portion of the first body may actuate back and forth (that is, toward and away from the second body) at a frequency in accordance with the frequency of the alternating electrical current pulses, creating a vibrational feel or sensation to the user. The frequency may be predetermined, or pre-defined by the user. In some instances, the first body may include a display assembly having a capacitive touch layer. In this manner, when the user touches the display assembly, and the user may receive a force feedback in the form of a short, single pulse or a vibration, notifying the user that the display assembly is depressed and a command is sent to further control the display assembly. The command may, for example, alter the visual information presented on the display assembly.

These and other embodiments are discussed below with reference to FIGS. 1-23. However, those skilled in the art will readily appreciate that the detailed description given herein with respect to these Figures is for explanatory purposes only and should not be construed as limiting.

FIG. 1 illustrates an isometric view of an embodiment of an accessory device 100 in a closed configuration, in accordance with the described embodiments. The accessory device 100 may be suitable for use with an electronic device (not shown), such as a desktop computer, a laptop computer, a smartphone, and/or a tablet computer. The accessory device 100 may include an enclosure 102 designed to enclose several components. Also, the accessory device 100 may include a first body 104. In some embodiments, the first body 104 includes a touch sensitive layer 106 (shown as dotted lines) embedded in the first body 104. The touch sensitive layer 106 is designed to detect a touch input from a user, with the touch input corresponding to a command to an electronic device that is paired, via a wired or wireless communication (such as 802.11 or Bluetooth protocol), with the accessory device 100. Also, the touch sensitive layer 106 may include a capacitive touch layer designed to generate an input and command based upon a capacitive coupling between the user and the touch sensitive layer 106.

The accessory device 100 may further include a second body 108. As shown, the first body 104 and the second body 108 are positioned in an opening 110 of the accessory device 100, with the second body 108 positioned below (or behind) the first body 104 to expose the touch sensitive layer 106 to a user. In this regard, the first body 104 may be referred to as an upper body and the second body 108 may be referred to a lower body. The accessory device 100 may further include a switch 112 coupled with the second body 108. The switch 112, when moved, is designed to drive or actuate the second body 108 laterally relative to the first body 104. In some embodiments, the switch 112 is fully embedded in the enclosure 102 and is operable with a display assembly of a laptop computer (not shown), as an example. In the embodiment shown in FIG. 1, the switch 112 is a mechanical switch protruding from the accessory device 100 and coupled with the second body 108.

Also, the first body 104 and the second body 108 may be magnetically coupled together by one or more magnets (not shown) disposed in both the first body 104 and the second body 108. For example, magnets in the first body 104 may be aligned with magnets in the second body 108 of opposite magnetic polarities (such as North Pole-South Pole alignment), creating several magnetic circuits that provide a magnetic attraction force holding the first body 104 together with the second body 108. As shown in FIG. 1, the first body 104 is magnetically coupled with the second body 108 such that the first body 104 is positioned in the opening 110 to define a closed configuration of the accessory device 100 in which the first body 104 is coplanar, or approximately coplanar, with respect to a top surface of the enclosure 102. This will be shown and described below.

Figure 2:
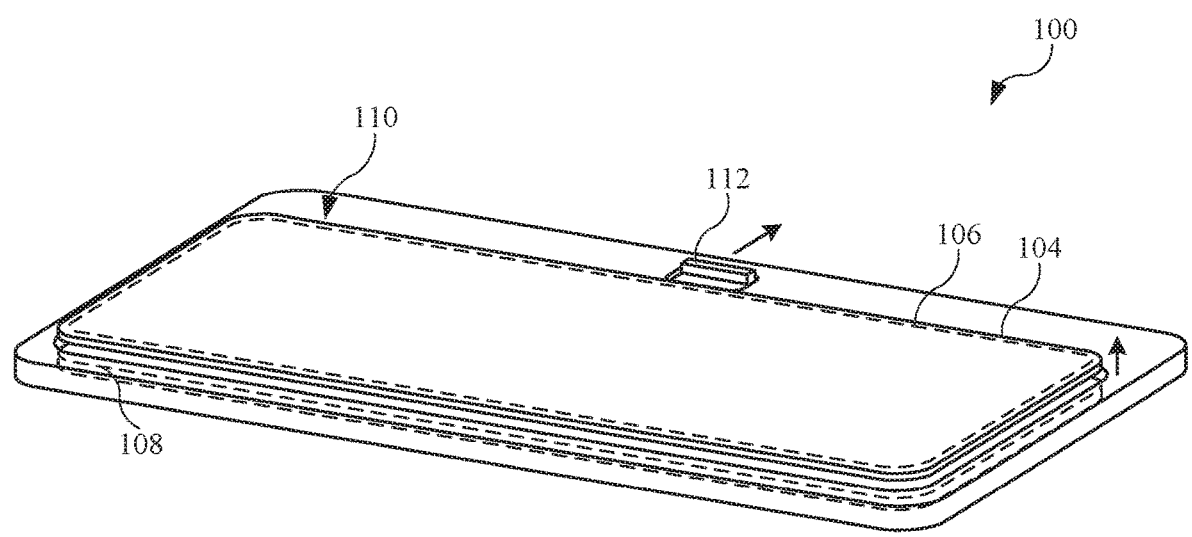
FIG. 2 illustrates an isometric view of the accessory device shown in FIG. 1, with the accessory device in an alternate configuration.

However, based upon the positioning of the second body 108 relative to the first body 104, the accessory device 100 may change configurations. For example, FIG. 2 illustrates an isometric view of the accessory device 100 shown in FIG. 1, with the accessory device 100 in an open configuration. The open configuration may be achieved by moving the switch 112, which causes the second body 108 to move relative to the first body 104. In this manner, the magnets in the first body 104 may be aligned with magnets in the second body 108 with the same magnetic polarities (such as a North Pole-North Pole or South Pole-South Pole alignment), causing magnets in the first body 104 to magnetically repel from magnets in the second body 108, and in turn, causing the first body 104 move away from the second body 108. As shown in FIG. 2, the first body 104 may extend beyond the opening 110, or at least partially extend beyond the opening 110, defining an open configuration of the accessory device 100 in which the first body 104 is above and non-coplanar with respect to a top surface of the enclosure 102.

Figure 3:
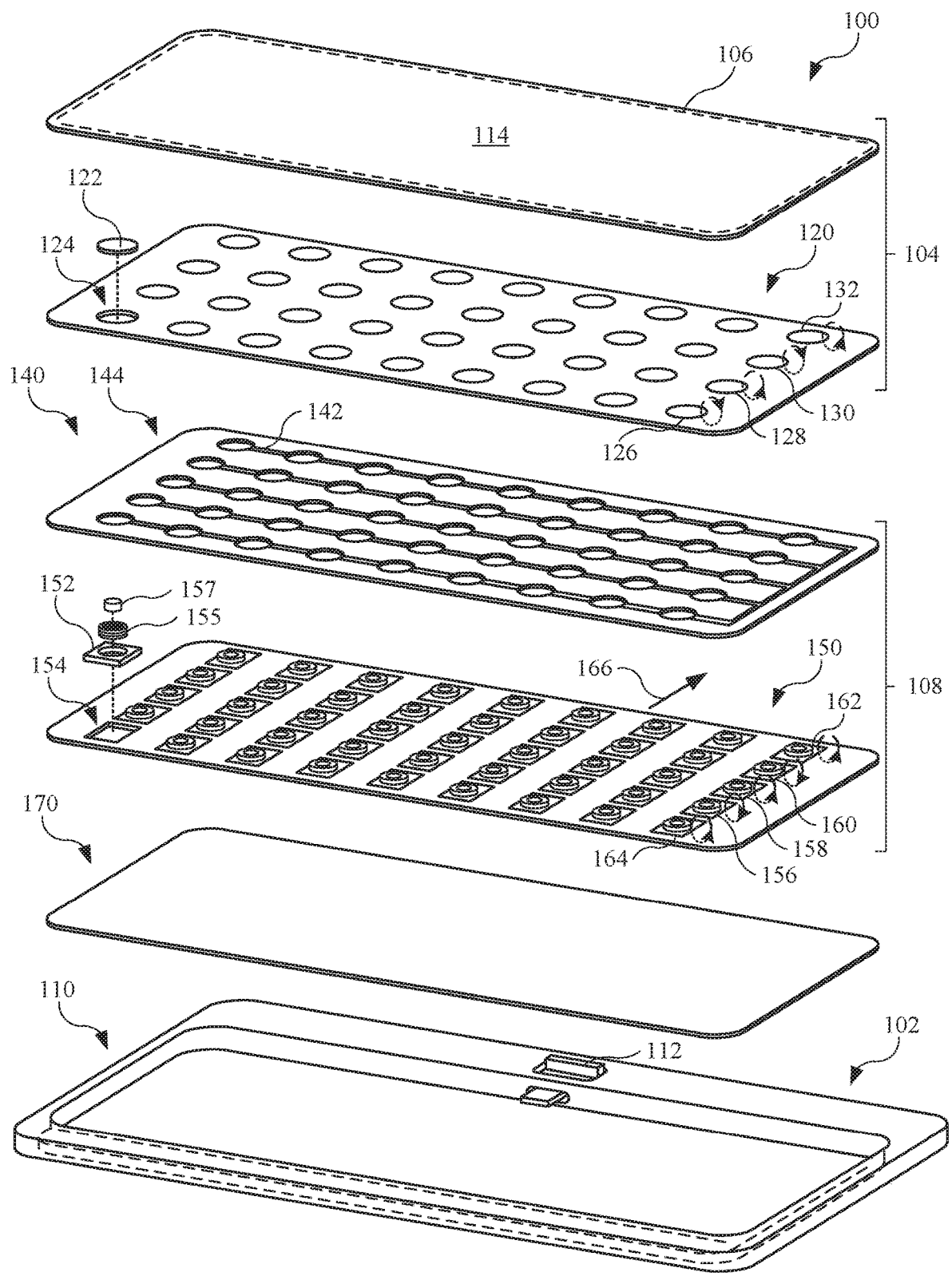
FIG. 3 illustrates an exploded view of the accessory device shown in FIG. 1, showing various features of the accessory device.

FIG. 3 illustrates an exploded view of the accessory device 100 shown in FIG. 1, showing various features of the accessory device 100. As shown, the first body 104 may include a fabric layer 114 that covers the touch sensitive layer 106. In other embodiments, the fabric layer 114 includes a touch sensitive fabric. The first body 104 may further include a first magnetic layer 120 that includes several magnets. As shown, the first magnetic layer 120 may include a magnet 122, representative of other several magnets (not labeled), disposed in an opening 124 of the first magnetic layer 120. While the magnets of the first magnetic layer 120 are shown having a circular shape, each of the magnets may be formed as a different shape, including a polygonal shape having four or more sides. Also, the openings of the first magnetic layer 120 may include a shape and size corresponding to that of the magnets. Also, in some cases, the magnets of the first magnetic layer 120 are formed from a composite bonded material subjected to a magnetic field from a magnetizer (not shown) after the composite bonded material is disposed in the first magnetic layer 120. This may reduce material costs as well as the weight of the accessory device 100, and may allow for a customized magnetic arrangement.

Also, as shown in FIG. 3, the first magnetic layer 120 includes a column of magnets that include first magnet 126, a second magnet 128, a third magnet 130, and a fourth magnet 132. The magnet polarity of the magnets in the column (and also in rows) may be opposite to one another. For example, as shown, the first magnet 126 includes a magnetic polarity that includes a top portion having a "North" polarity and a bottom portion (not shown) opposite the top portion having a "South" polarity to form an external magnetic field (represented by dotted lines) in a first direction. Conversely, the second magnet 128 (adjacent to the first magnet 126) includes a magnetic polarity such that a top portion includes a "South" polarity and a bottom portion (not shown) includes a "North" polarity to form an external magnetic field in a second direction opposite the first direction (of the first magnet 126). Also, the third magnet 130 may include a magnetic polarity similar to that of the first magnet 126, and the fourth magnet 132 may include magnetic polarity similar to that of the second magnet 128. This will be further discussed below.

The second body 108 may include a circuit board assembly 140. In some embodiments, the circuit board assembly 140 is a printed circuit board ("PBC"). The circuit board assembly 140 may include a metal trace 142 designed to carry electrical current and signals to and from other features of the second body 108 (discussed below). Also, the circuit board assembly 140 may include openings 144 throughout the circuit board assembly 140. The openings 144 may be designed to receive one or more features disposed in the second body 108 (discussed below).

A second magnetic layer 150 disposed in the second body 108 may also include several magnets. For example, the second magnetic layer 150 may include a magnet 152, representative of several other magnets (not labeled) in the second magnetic layer 150, disposed in an opening 154 of the second magnetic layer 150. While the magnets of the second magnetic layer 150 are shown having a four-sided shape, each of the magnets may be formed according to a different shape, including a circular shape, a triangular shape, or a shape having five or more sides. The openings of the second magnetic layer 150 may include a size and shape corresponding to that of the magnets. Also, the magnets of the second magnetic layer 150 may be formed by any means previously described for magnets in the first magnetic layer 120.

Also, as shown in FIG. 3, each magnet of the second magnetic layer 150 may include coil disposed in an opening of each magnet. For example, the magnet 152 includes a coil 155. Each coil may be electrically coupled with the circuit board assembly 140, by way of the metal trace 142, in order to receive electrical current via the circuit board assembly 140. This allows the coil to act as a solenoid, and form an external electromagnetic field capable of attracting one or more magnets disposed in the first magnetic layer 120. Also, each coil may surround a metal block positioned within each coil. The metal block may include iron or steel, for example, or generally any material that may be attracted to a magnet. For example, as shown in FIG. 3, the coil 155 includes a metal block 157. The metal block 157 may be magnetically attracted to the magnet 122 disposed in the first magnetic layer 120. Also, each coil and each metal block of the second magnetic layer 150 may be at least partially received by one of the openings of the circuit board assembly 140. These features will be further described below.

Also, as shown in FIG. 3, the second magnetic layer 150 may further include a column of magnets that include first magnet 156, a second magnet 158, a third magnet 160, a fourth magnet 162 and a fifth magnet 164. Similar to the first magnetic layer 120, the magnet polarity of the magnets in the column (and also in rows) may be opposite to one another. For example, as shown, the first magnet 156 includes a magnetic polarity similar to that of the first magnet 126 of the first magnetic layer 120. Conversely, the second magnet 158 includes a magnetic polarity similar to that of the second magnet 128 of the first magnetic layer 120. Also, the third magnet 160 includes a magnetic polarity similar to that of the first magnet 156, and the fourth magnet 162 includes magnetic polarity similar to that of the second magnet 158. In addition, the fifth magnet 164 may include a magnet polarity similar to that of the second magnet 158.

In one configuration, the magnets of the first magnetic layer 120 may magnetically couple with a magnet in the second magnetic layer 150, causing the first body 104 to magnetically couple with the second body 108 (by way of their respective magnets) to define the closed configuration of the accessory device 100 (shown in FIG. 1). For example, the first magnet 126 of the first magnetic layer 120 can be aligned and positioned to magnetically couple with the first magnet 156 in the second magnetic layer 150. However, in another configuration, when the second body 108 is driven or actuated with the respect to the first body 104 in a direction (denoted by an arrow 166), the magnets of the first magnetic layer 120 may be aligned with magnets in the second magnetic layer 150 such that the magnets of the respective magnetic layers are magnetically repelled by one another. For example, when the second body 108, along with the second magnetic layer 1550, is shifted, the first magnet 126 of the first magnetic layer 120 aligns with the fifth magnet 164 of the second magnetic layer 150, and the first magnet 126 is magnetically repelled from the fifth magnet 164. The first body 104 may magnetically repel form the second body 108 (by way of their respective magnets) to define the open configuration of the accessory device 100 (shown in FIG. 2). This will be discussed in further detail below.

In this regard, FIG. 3 further shows that the second magnetic layer 150 including an additional row of magnets as compared to the first magnetic layer 120. Accordingly, the second magnetic layer 150 may be larger than the first magnetic layer 120. Also, in some embodiments, the accessory device 100 may further include a protective layer 170. The protective layer 170 may be formed from a material, such as fiberglass, used to protect the aforementioned component as well as provide structural support to the accessory device 100.

Also, although not shown, the accessory device 100 may include a processor circuit used to process one or more commands received by the accessory device 100. In addition, the accessory device 100 may include a memory circuit coupled with the processor circuit and designed to store one or more programs for use by the processor circuit. Further, the accessory device 100 may include an internal power supply (not shown), such as a battery. The internal power supply may supply electrical current to any feature or features described that require electrical current, such as the touch sensitive layer 106 and the processor circuit.

Figure 4:
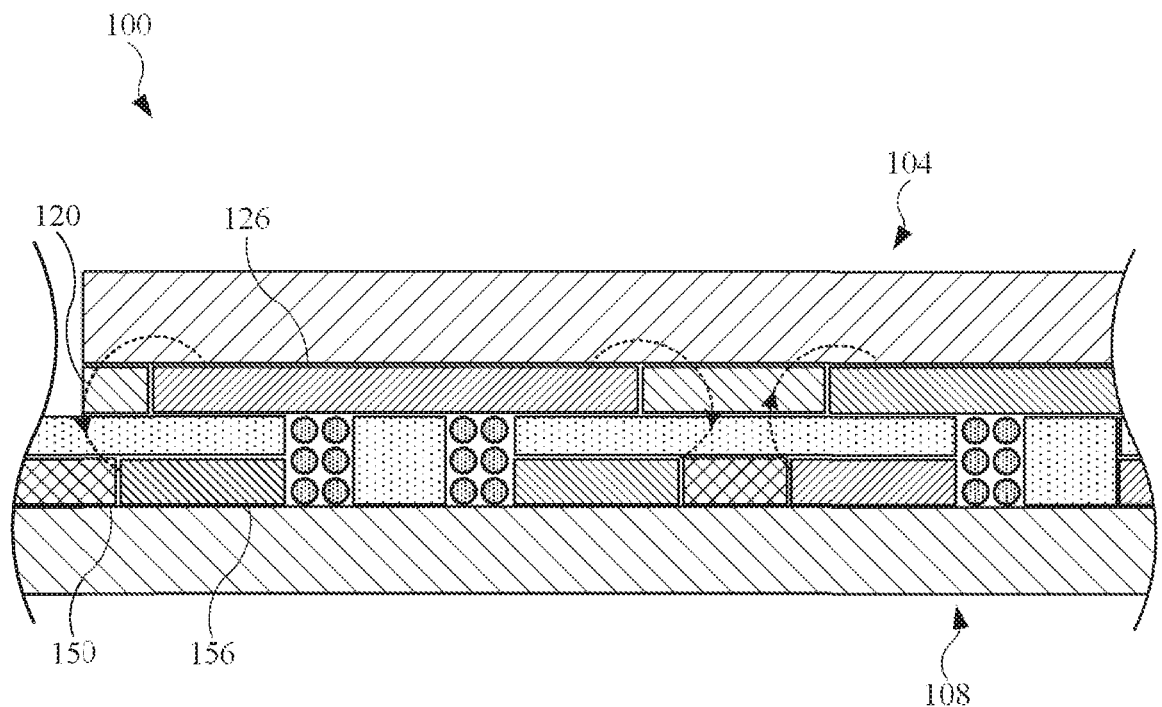
FIG. 4 illustrates a cross sectional view of the accessory device in the closed configuration.
Figure 5:
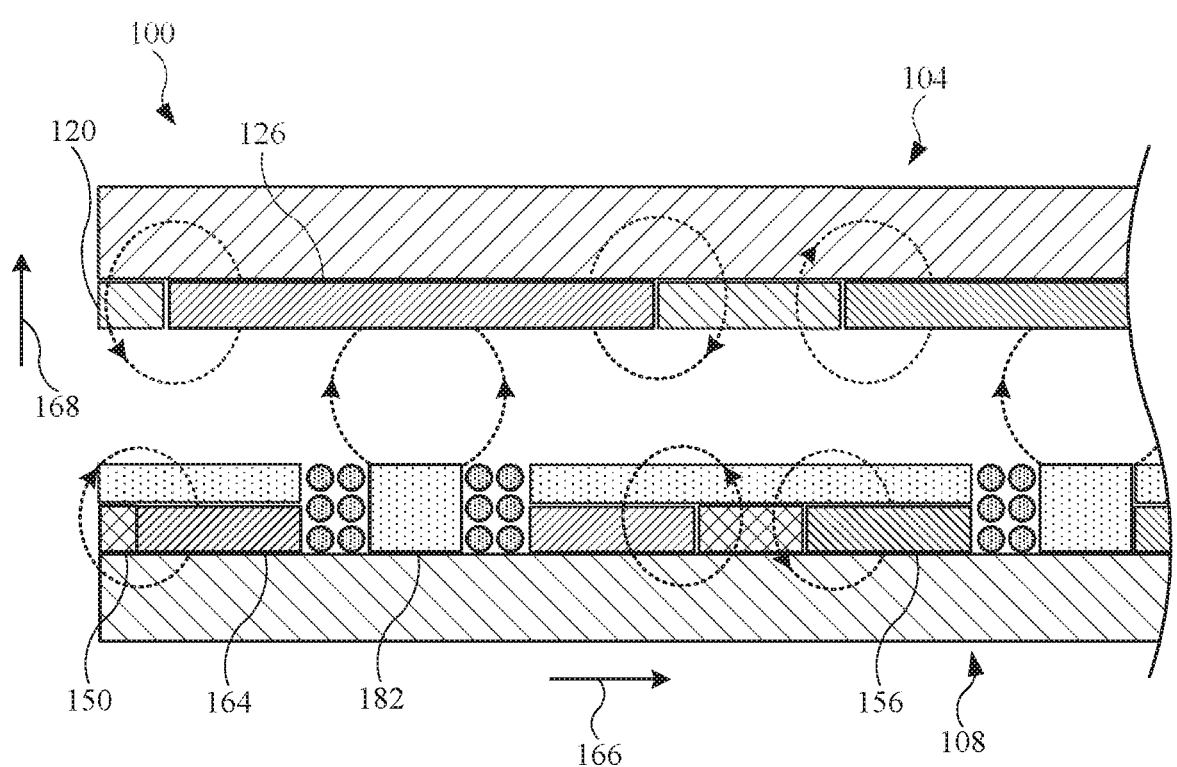
FIG. 5 illustrates a cross sectional view of the accessory device in the open configuration.

FIGS. 4 and 5 further show the relationship between the first body 104 and the second body 108, based in part on the magnets of the respective bodies. For purposes of simplicity and illustration, some features and components may be removed in FIGS. 4 and 5. FIG. 4 illustrates a cross sectional view of the accessory device 100 in the closed configuration (also shown in FIG. 1). In the closed configuration, each of the magnets of the first magnetic layer 120 may magnetically couple with a magnet of the second magnetic layer 150 to form several magnetic circuits. As a representative example, the first magnet 126 of the first magnetic layer 120 magnetically couples with the first magnet 156 of the second magnetic layer 150 to form a magnetic circuit denoted by the external magnetic field lines (shown as dotted lines). A similar magnetic coupling may form between the remaining magnets in the first magnetic layer 120 and at least some of the magnets in the second magnetic layer 150.

However, when the second body 108 is driven or actuated with respect to the first body 104, the magnetic circuits between the first body 104 and the second body 108 cease. For example, FIG. 5 illustrates a cross sectional view of the accessory device 100 in the open configuration (also shown in FIG. 2). As shown, the second body 108 is driven with respect to the first body 104 in a direction denoted by the arrow 166. In this manner, the magnets in the first magnetic layer 120 are aligned with magnets in the second magnetic layer 150 such that the same magnetic polarities (of the respective magnetic layers) are aligned with one another. For example, the first magnet 126 of the first magnetic layer 120 is now aligned with the fifth magnet 164 (also shown in FIG. 3) of the second magnetic layer 150. Accordingly, the "South" pole of the first magnet 126 is aligned with the "South" pole of the fifth magnet 164, causing the first magnet 126 to repel from the fifth magnet 164. A similar repelling configuration may between remaining magnets of the first magnetic layer 120 and at least some of the magnets of the second magnetic layer 150. Accordingly, the first body 104 may magnetically repel from the second body 108, causing the first body 104 to be driven in a direction denoted by a second arrow 168.

In some cases, the magnetic repulsion of the first body 104 may cause the first body 104 to move laterally with respect to the second body 108. For example, the first magnet 126 of the first magnetic layer 120 may attempt to move laterally in order to form (or re-form) a magnetic circuit with the first magnet 156 of the second magnetic layer 150. However, the metal blocks of second body 108 can magnetically couple with the magnets of the first body 104 in order to maintain a desired alignment between the first body 104 and the second body 108. For example, as shown in FIG. 5, a metal block 182 disposed in the fifth magnet 164 may magnetically couple with the first magnet 126. Similarly, the remaining metal blocks in the second magnetic layer 150 may provide a similar magnetic coupling to provide a force that prevents or limits unwanted lateral movement of the first body 104 with respect to the second body 108. Although not shown, other mechanical alignment features may be present to align the first body 104 with the second body 108 in a desired manner.

While exemplary features shown in FIGS. 3-5 are shown and described, these exemplary features may be representative of the remaining features. For example, several magnet circuits may be formed between the magnets of the first magnetic layer 120 and the second magnetic layer 150 (shown in FIG. 3) may be formed. Conversely, by actuating the second body 108, all of the magnets of the first body 104 may be repelled by at least one magnet in the second magnetic layer 150. Further, various magnetic polarity configurations may be formed that are consistent with the features in order to form the open and closed configurations of the accessory device 100.

Figure 6:
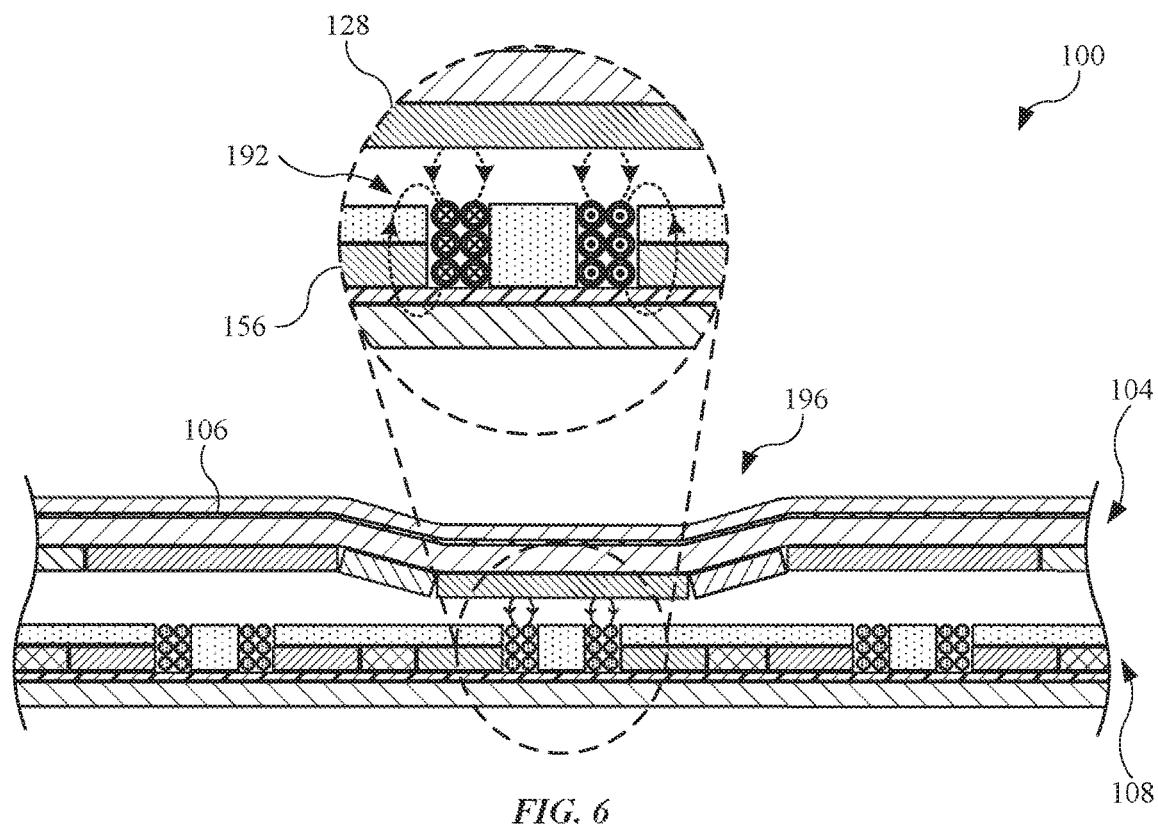
FIG. 6 illustrates a cross sectional view of the accessory device, showing a portion of the first body actuated in response to a magnetic coupling with a coil in the second body.

When the accessory device 100 is in the open configuration, selected portions of the first body 104 may be driven or actuated with respect to other portions of the first body 104. For example, FIG. 6 illustrates a cross sectional view of the accessory device 100, showing a portion of the first body 104 actuated in response to a magnetic coupling with a coil 192 in the second body 108. As shown in the enlarged view, although the second magnet 128 of the first magnetic layer 120 may magnetically repel form the first magnet 156 of the second magnetic layer 150, an electrical current may pass through the coil 192, causing the coil 192 to form an external electromagnetic field magnetic attraction force with the second magnet 128 and also overcome the magnetically repelling force by the first magnet 156 in the second magnetic layer 150. In response to a depression 196 caused by, for example, a touch input to the first body 104 detected by the touch sensitive layer 106, electrical current passes through the coil 192. As shown, the electromagnetic field from the coil 192 causes the second magnet 128 to magnetically couple with the second magnet 128, and due to the magnetic coupling, the second magnet 128 moves in a direction toward the coil 192.

Figure 7:
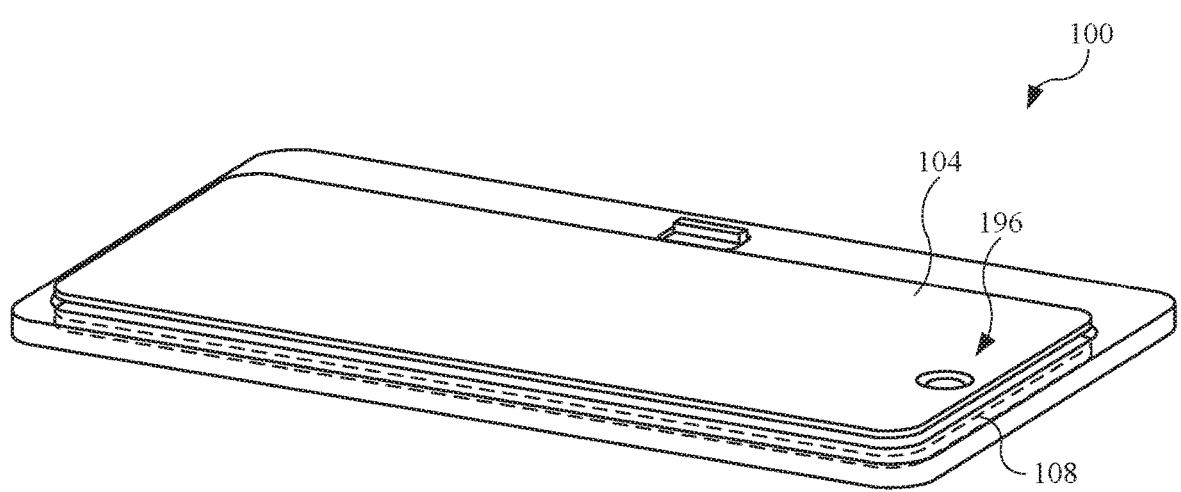
FIG. 7 illustrates an isometric view of the accessory device, showing the first body actuated in response to a magnetic coupling with a coil in the second body.

FIG. 7 illustrates an isometric view of the accessory device 100, showing the first body 104 actuated in response to a magnetic coupling with a coil in the second body 108. As shown, the depression 196 in the first body 104, caused by the touch inputs, may initiate the coil 192 (shown in FIG. 6) to generate an external electromagnetic field that magnetically couples with a magnet in the first body 104. When the depression 196 is removed (by, for example, a user no longer touching the first body 104), the electrical current ceases from passing through the coil 192 to terminate the external electromagnetic field, and the first body 104 returns to its original configuration.

FIGS. 6 and 7 describe a coil 192 used as a force feedback mechanism in the accessory device 100. The force feedback mechanism may be used to provide a sensation to a user of the accessory device 100. Although not shown, the electrical current may pass through the coil 192 as an electrical current pulse. Further, in some cases, the electrical current pulse may alternate through the coil 192 to change the magnetic polarity of the coil 192. Any coil of the accessory device 100 may be used in a manner similar to the coil 192 shown in FIG. 6. Also, although not shown, two or more coils may be used together to drive or actuate multiple portions of the first body 104.

Figure 8:
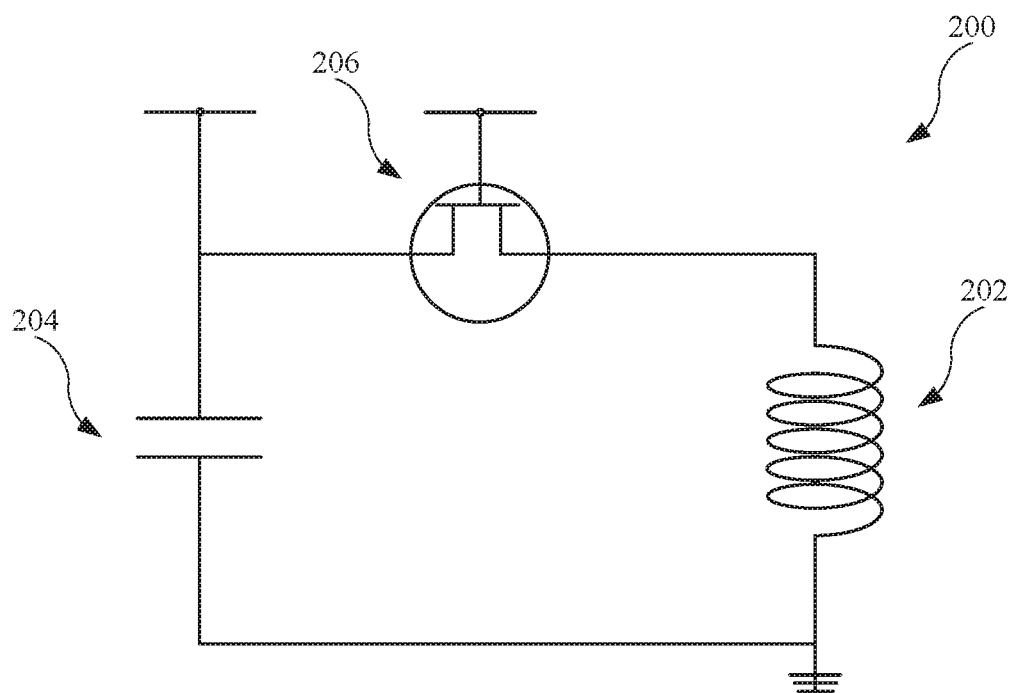
FIG. 8 illustrates an exemplary circuit diagram used to control electrical current distributed to a coil in an accessory device, in accordance with the described embodiments.

In order to control the electrical current through the coils, an accessory device in accordance with the described embodiments may include several configurations. For example, FIG. 8 illustrates a circuit diagram of a circuit 200 used to control electrical current distributed to a coil 202 in an accessory device, in accordance with the described embodiments. As shown, the circuit 200 may include a capacitor 204 used to store an electrical charge. The capacitor 204 may allow electrical current to pass through the coil 202 as permitted by a transistor 206. For example, when electrical current is supplied to a gate of the transistor 206, the capacitor 204 may discharge and allow electrical current to flow through the coil 202. The transistor 206 may permit the electrical current to pass according to a touch input detected by the touch sensitive layer 106 (shown in FIG. 6). The coil 202 may then take the form of an electromagnetic coil while the electrical current is supplied to the coil 202. In some embodiments, a touch input (or inputs) registered at the touch sensitive layer 106 (shown in FIG. 2) causes the transistor 206 to permit an electrical discharge from the capacitor 204 to the coil 202. The transistor 206 may be a field-effect transistor ("FET").

Figure 9:
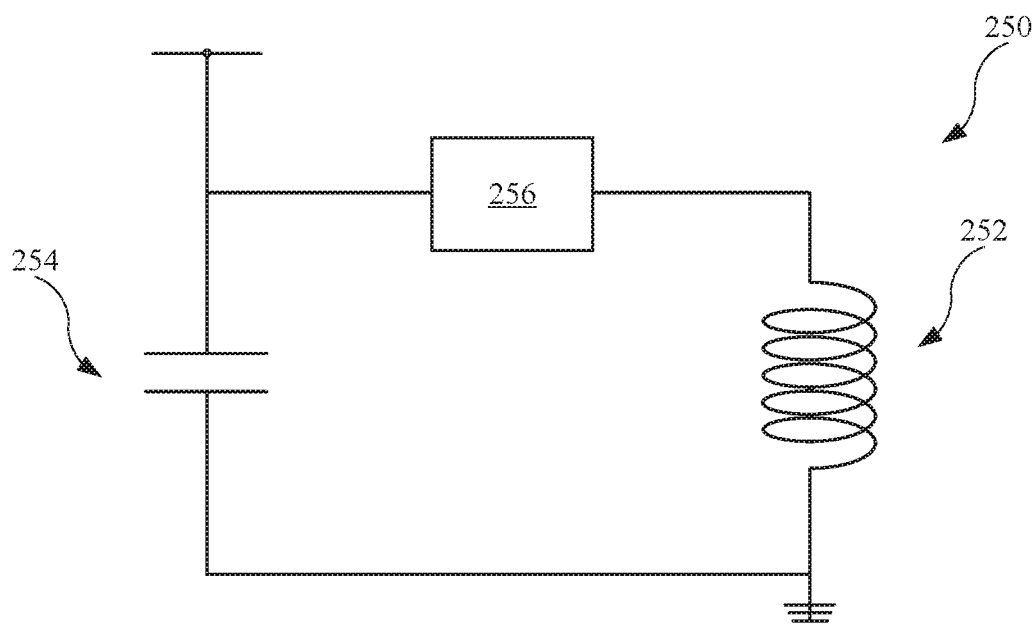
FIG. 9 illustrates an alternate circuit diagram used to control the electrical current distributed to a coil in an accessory device, in accordance with the described embodiments.

FIG. 9 illustrates an alternate circuit diagram of a circuit 250 used to control the electrical current distributed to a coil 252 in an accessory device, in accordance with the described embodiments. The circuit 250 may include a capacitor 254 that may allow electrical current to pass through the coil 252 as permitted by a controller 256. The controller 256 may be used in conjunction with a software program (not shown) designed to allow the capacitor 254 to discharge electrical current through the coil 252 in accordance with a touch input detected by the touch sensitive layer 106 (shown in FIG. 6). The coil 252 may then take the form of an electromagnetic coil generating an external electromagnetic field. In some embodiments, the controller 256 allows electrical current to pass through the coil 252 according to user-specified conditions. For example, the controller 256 may allow the capacitor 254 to discharge electrical current through the coil 252 in a single short burst. Alternatively, the controller 256 may allow the capacitor 254 to discharge electrical current through the coil 252 for an extended time period. Still, in another alternative, the controller 256 may allow the capacitor 254 to discharge electrical current through the coil 252 according to a series of several short bursts. In some embodiments, a touch input (or inputs) registered at the touch sensitive layer 106 (shown in FIG. 2) causes the controller 256 to permit an electrical discharge from the capacitor 254 to the coil 252. Also, in some embodiments, the controller 256 may work without the use of the capacitor 254.

FIGS. 10-22 show and describe alternate embodiments of an accessory device. While in some cases, the magnetic arrangements previously described may not be discussed, the embodiments shown in FIGS. 10-22 may include any magnetic arrangement previously described in order to form an open and closed configuration of the accessory device. Further, the embodiments shown in FIGS. 10-22 may include any feature, including circuitry, previously described for an accessory device, in order to create a force feedback.

Figure 10:
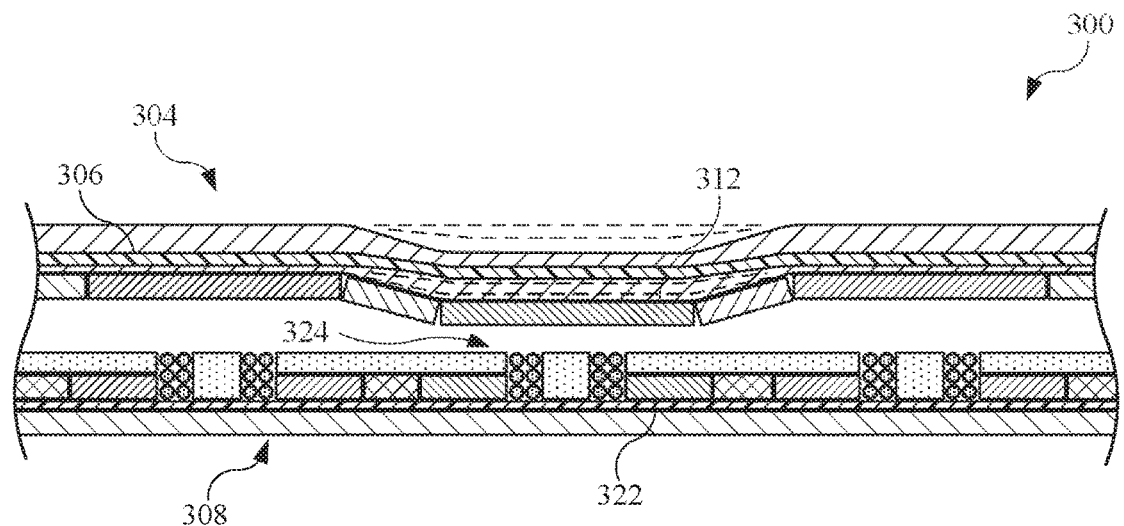
FIG. 10 illustrates a cross sectional view of an accessory device, showing the first body actuated according to a repeated manner to produce vibrational movement in response to a magnetic coupling with a coil in the second body.

In some cases, the accessory device may provide a specific force feedback mechanism to a user. For example, FIG. 10 illustrates a cross sectional view of an accessory device 300, showing the first body 304 actuated according to a repeated manner to produce vibrational movement in response to a magnetic coupling with a coil 324 in the second body 308. As shown, the accessory device 300 is in an open configuration formed in a manner previously described.

As shown, the first body 304 includes a magnet 312 aligned with a magnet 322 in the second body 308, with both magnets facing each other with the same magnetic polarity causing the magnets to repel one another. However, the second body 308 may include a coil (positioned within the magnet 322) that forms an external electromagnetic field causing a magnetic coupling with the magnet 312. As a result, this may cause a portion of the first body 304 to move with respect to a surrounding area of the first body 304, and in a direction toward the second body 308. The touch sensitive layer 306 may include a sensor, or sensing element, designed to detect a touch input anywhere along the touch sensitive layer 306. Alternatively, the coil 324 may include a sensor, or sensing element, designed to detect a touch input to the first body 304. In this manner, a coil may serve a dual purpose of a detection mechanism and an actuating mechanism. It will be appreciated that the coil 324 may be a representative coil of the remaining coils in the accessory device 300.

In some embodiments, the accessory device 300 may be designed to provide a force feedback in the form of a vibrational sensation to a user. For example, the electrical current may pass through the coil 324 in short bursts such that the coil 324 forms an electromagnetic coil in shorts bursts. Accordingly, the magnet 312 may be magnetically attracted to the coil 324 (as an electromagnetic coil) in short bursts, causing movement of the magnet 312 and the first body 304 back and forth, in accordance with the short bursts and the electrical current passing through the coil 324. The dotted lines in FIG. 10 represent the first body 304 moving back and forth in short bursts, defining the vibrational sensation that may be felt by a user. Also, in order to enhance the vibrational movement, electrical current may pass through the coil 324 in opposite directions such that the coil 324 forms an external electromagnetic field that changes its magnetic polarity.

Figure 11:
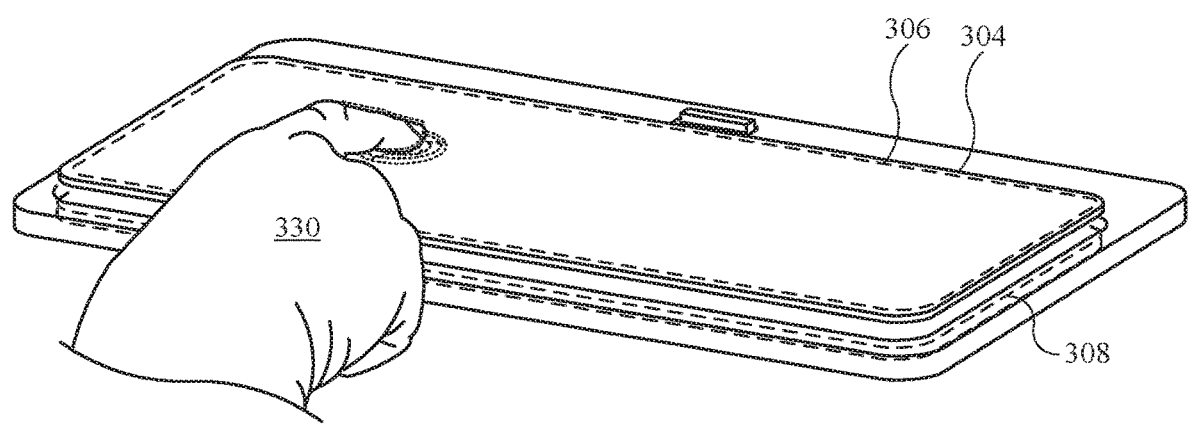
FIG. 11 illustrates an isometric view of the accessory device, showing the first body actuated according to a repeated manner to produce vibrational movement in response to a magnetic coupling with a coil in the second layer.

FIG. 11 illustrates an isometric view of the accessory device 300, showing the first body 304 actuated according to a repeated, vibrational movement defining a force feedback in response to a magnetic coupling with a coil (not shown) in the second body 308. As shown, a user 330 may generate the vibrational movement by touching, or forming a capacitive coupling, with the first body 304, and in particular, with the touch sensitive layer 306 in the first body 304. When the touch sensitive layer 306 detects the touch input, the touch sensitive layer 306 may signal to a controller (such as a controller 256 shown in FIG. 9) to allow electrical current to pass through a coil (or coils) in the second body 308, such as a coil corresponding to a location of the touch input by the user 330. In particular, the electrical current may pass in a several short bursts, and may pass through the coil (or coils) in short bursts in the opposite direction. In this manner, as shown in FIG. 11, the user 330 may feel a vibrational sensation according to the coil (such as the coil 324 in FIG. 10) forming an external electromagnetic field in a short, repeated manner and momentarily attracting a magnet (such as the magnet 312 in FIG. 10) in a short, repeated manner.

Figure 12:
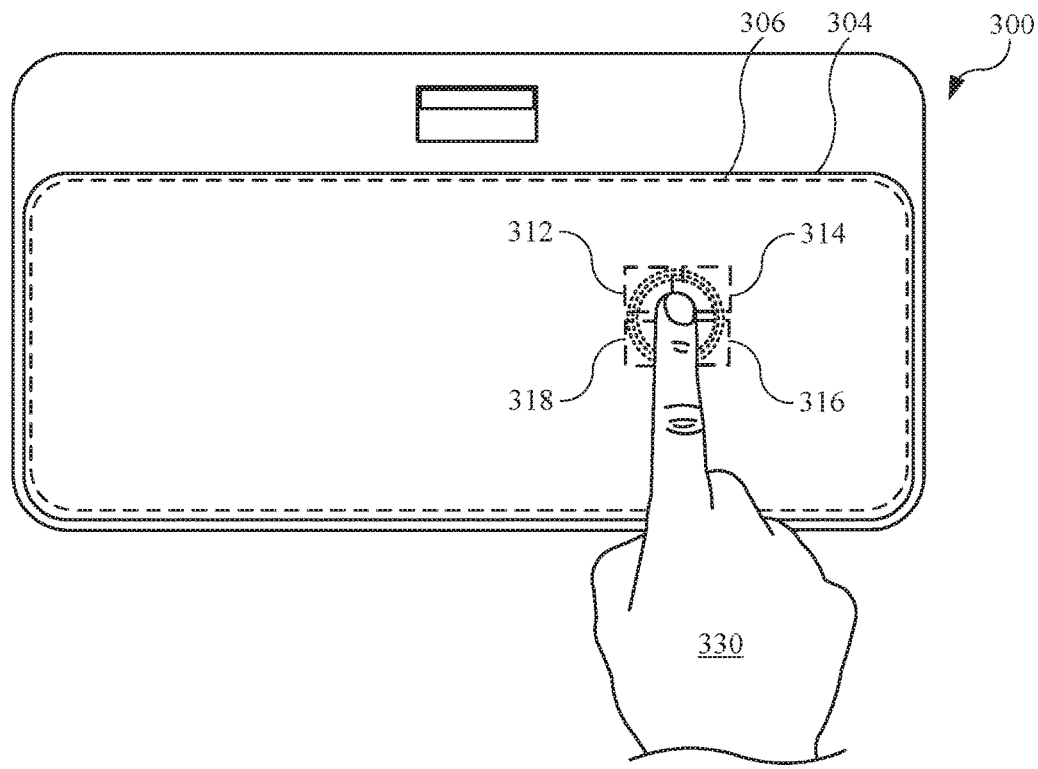
FIG. 12 illustrates a plan view of the accessory device, showing multiple magnets of the first body actuated in response based upon an input received at the first body.

In some cases, a user may active multiple coils simultaneously. For example, FIG. 12 illustrates a plan view of the accessory device 300, showing multiple magnets of the first body 304 actuated in response based upon an input received at the first body 304. As shown, the user 330 may create an input by coupling with touch sensitive layer 306 causing multiple coils (not shown) to create a force feedback. For example, the first body 304, having a magnet 312, a second magnet 314, a third magnet 316, and a fourth magnet 318 may combine to cause the first body 304 to move in a repeated, vibrational manner based upon each of the aforementioned magnets magnetically coupling with their respective coils in a short, repeated manner. This may be in response to the user 330 pressing the first body 304 with a relatively large force. Also, although not shown, the user 330 may depress the first body 304 in multiple locations along the first body 304, causing the touch sensitive layer 306 to generate at an input to a controller 256 (shown in FIG. 9) in multiple locations. This may cause the controller 256 to permit electrical current to one or more coils throughout the first body 304, causing the one or more coils to magnetically couple with a magnet in the first body 304.

Figure 13:
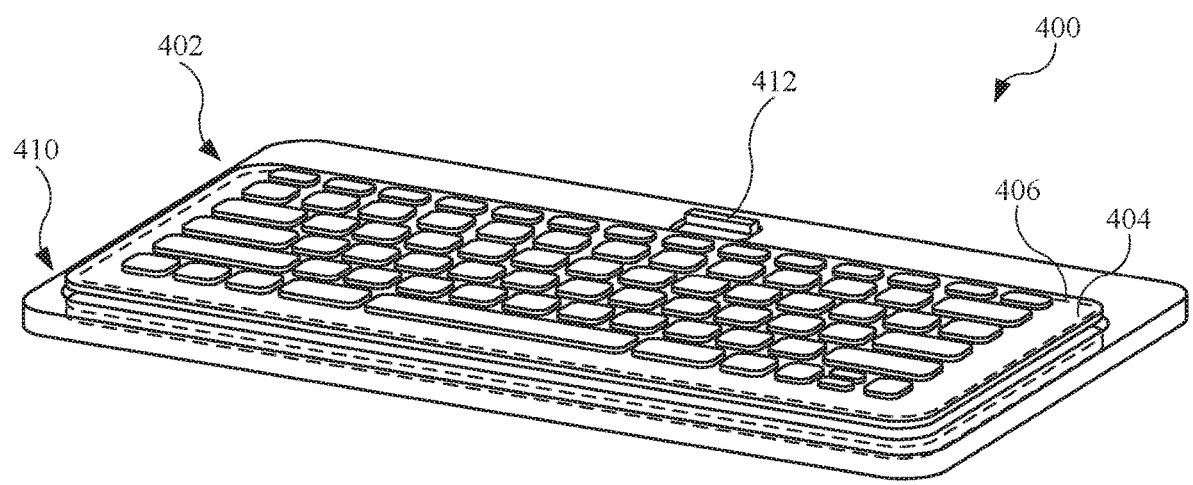
FIG. 13 illustrates an isometric view of an alternate embodiment of an accessory device, showing a keyboard disposed on a first body of the accessory device, in accordance with the described embodiments.

FIG. 13 illustrates an isometric view of an alternate embodiment of an accessory device 400, showing a keyboard 402 disposed on a first body 404 of the accessory device 400, in accordance with the described embodiments. The keyboard 402 may be designed to include a QWERTY configuration generally known in the art for a keyboard. Also, the keyboard 402 may be used in conjunction with an electronic device (not shown) when the accessory device 400 is synced or paired with the electronic device via a wired or wireless configuration. Each key of the keyboard 402 may be coupled with a touch sensitive layer 406 designed to detect a keystroke when a key is depressed. Also, as shown in FIG. 13, the accessory device 400 is in open configuration as the first body 404 and the keyboard 402 are at least partially extending from an opening 410 of the accessory device 400. However, the accessory device 400 may also change its configuration to a closed configuration by, for example, actuating a switch 412, causing a magnetic coupling previously described.

Figure 14:
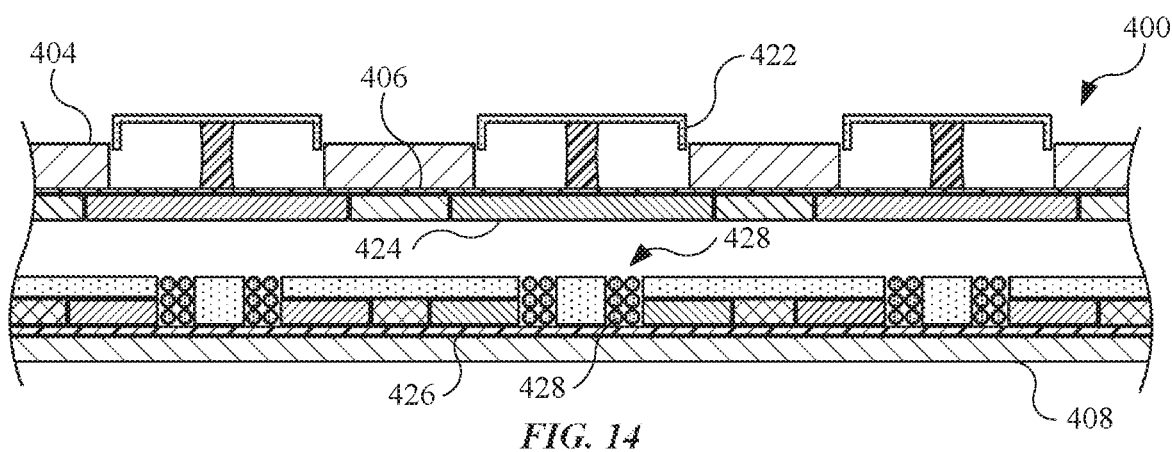
FIG. 14 illustrates a cross sectional view of the accessory device shown in FIG. 13, showing the first body having several keys and magnets disposed over the second body having several magnets and coils.
Figure 15:
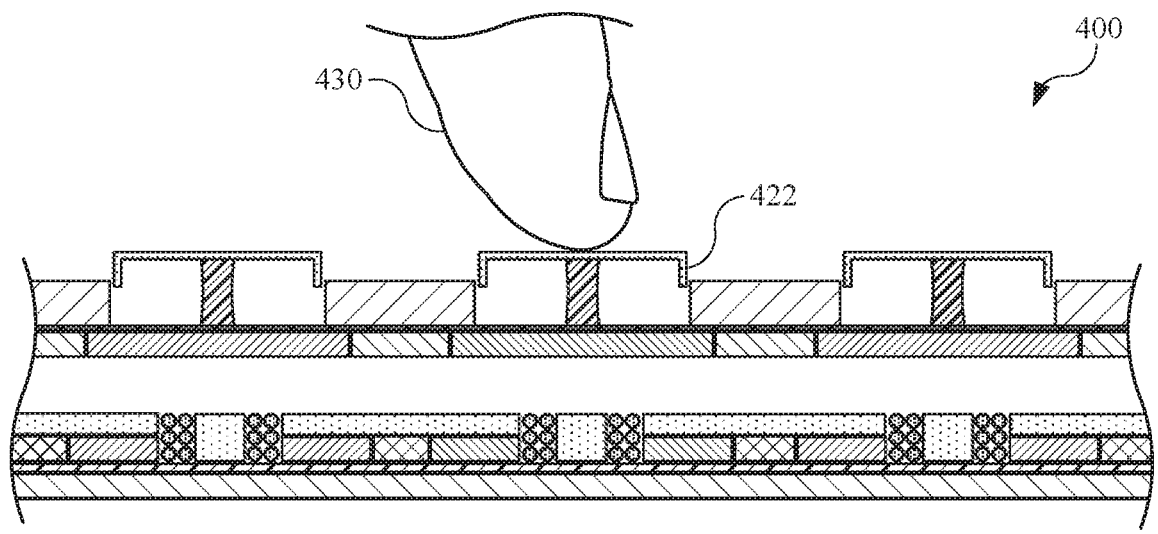
FIG. 15 illustrates a cross sectional view of the accessory device shown in FIG. 14, further showing an input received at the first body.
Figure 16:
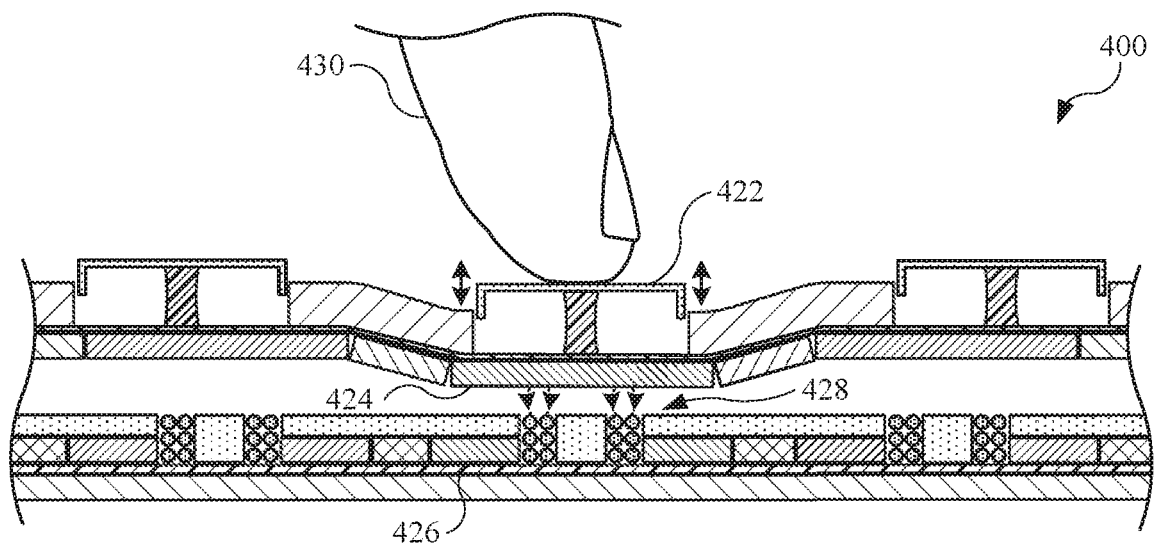
FIG. 16 illustrates a cross sectional view of the accessory device shown in FIG. 15, further showing the first body moving in response to the input received at the first body.

FIGS. 14-16 illustrate an exemplary keystroke that may be performed to a key, representative of any key or keys of the keyboard 402 shown in FIG. 13. FIG. 14 illustrates a cross sectional view of the accessory device 400 shown in FIG. 13, showing the first body 404 having several keys and magnets disposed over the second body 408 having several magnets and coils. As shown, the accessory device 400 is in the open configuration. Also, the first body 404 may include several keys, such as a key 422, electrically coupled with the touch sensitive layer 406. Also, the key 422 may be disposed above a magnet 424 disposed in the first body 404. The second body 408 may include a magnet 426 aligned with the magnet 424 with the same magnetic polarities facing each other to such that the magnet 424 and the magnet 426 magnetically repel each other. Also, the magnet 426 may include a coil 428 disposed in an opening of the magnet 426.

FIG. 15 illustrates a cross sectional view of the accessory device 400 shown in FIG. 14, further showing an input received at the first body 404. For example, the input may be in the form of a user 430 making contact with the key 422. In this manner, the touch sensitive layer 406 may detect a touch event of the key 422, or any key, of the keyboard 402 (shown in FIG. 13).

FIG. 16 illustrates a cross sectional view of the accessory device 400 shown in FIG. 15, further showing the first body 404 moving in response to the input received at the first body 404. As shown, when the user 430 contacts the key 422, the touch sensitive layer 406 may signal a coupling between the user 430 and the key 422, causing electrical current to pass through the coil 428. When the coil 428 forms an external electromagnetic field, the coil 428 magnetically couples with the magnet 424, causing the key 422 to be driven or actuated toward the coil 428 (despite the magnetic repulsion between the magnet 424 and the magnet 426). Accordingly, the magnetic coupling may cause the driving force of the key 422 simply by the user 430 making contact with the key 422. Further, once the key 422 is driven toward the coil 428, the electrical current may cease through the coil 428, and the key is returned to its original position. In this manner, the accessory device 400 may use a magnetic coupling to define a keystroke of a keyboard. Further, a force feedback may resemble a "click" configuration commonly found in tactile keyboards. Also, if desired, the keyboard 402 (shown in FIG. 13) may be designed to include a force feedback in the form of a vibrational movement of the key 422 in a manner previously described, based upon the current passing through the coil 428 in short bursts.

Figure 17:
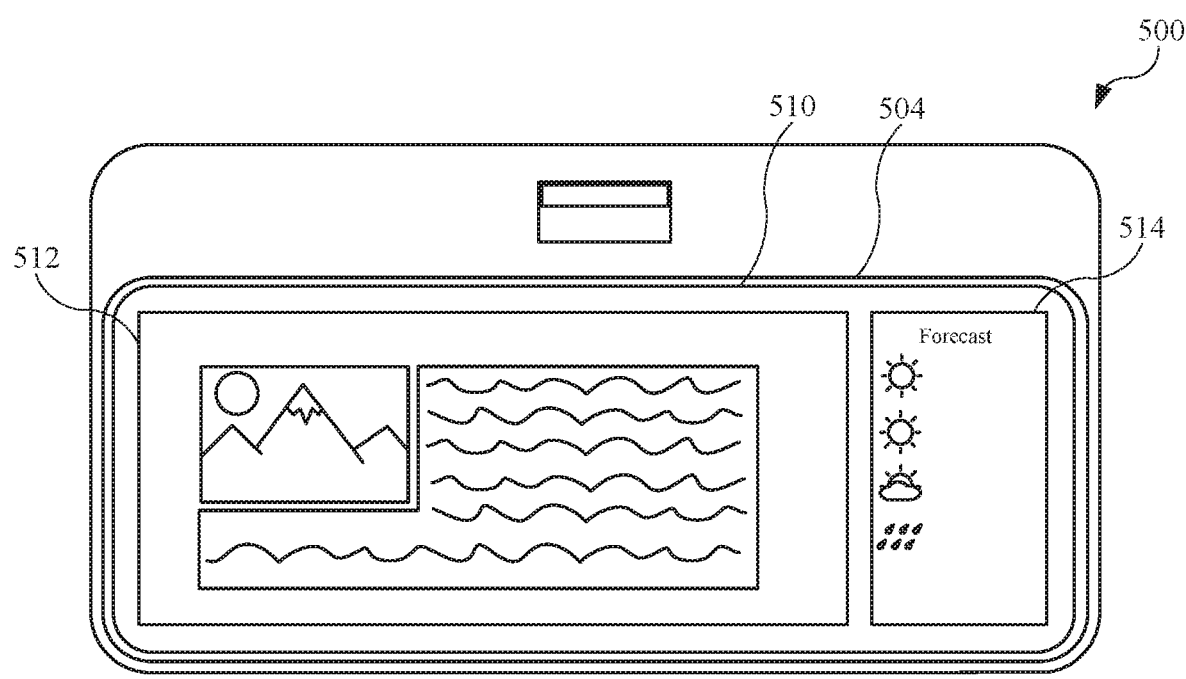
FIG. 17 illustrates a plan view of an alternate embodiment of an accessory device, showing a first body having a display assembly, in accordance with the described embodiments.

An accessory device may include additional features disposed on a first body. For example, FIG. 17 illustrates a plan view of an alternate embodiment of an accessory device 500, showing a first body 504 having a display assembly 510, in accordance with the described embodiments. In some embodiments, the display assembly 510 includes a capacitive touch sensitive layer integrated with the display assembly 510. As shown, the display assembly 510 may be designed to present visual information. As non-limiting examples shown in FIG. 17, the display assembly 510 may present a web browser 512 and a software application 514. Also, the accessory device 500 may be used in conjunction with an electronic device (not shown) when the accessory device 500 is synced or paired with the electronic device via a wired or wireless configuration. Alternatively, the accessory device 500 may be used as a "standalone" device. In this manner, the accessory device 500 may be designed to work independently from an electronic device (not shown) when the accessory device 500 is not paired with the electronic device. Accordingly, the accessory device 500 may include the necessary internal components, including processor circuits, memory circuits, and an internal power supply.

Figure 18:
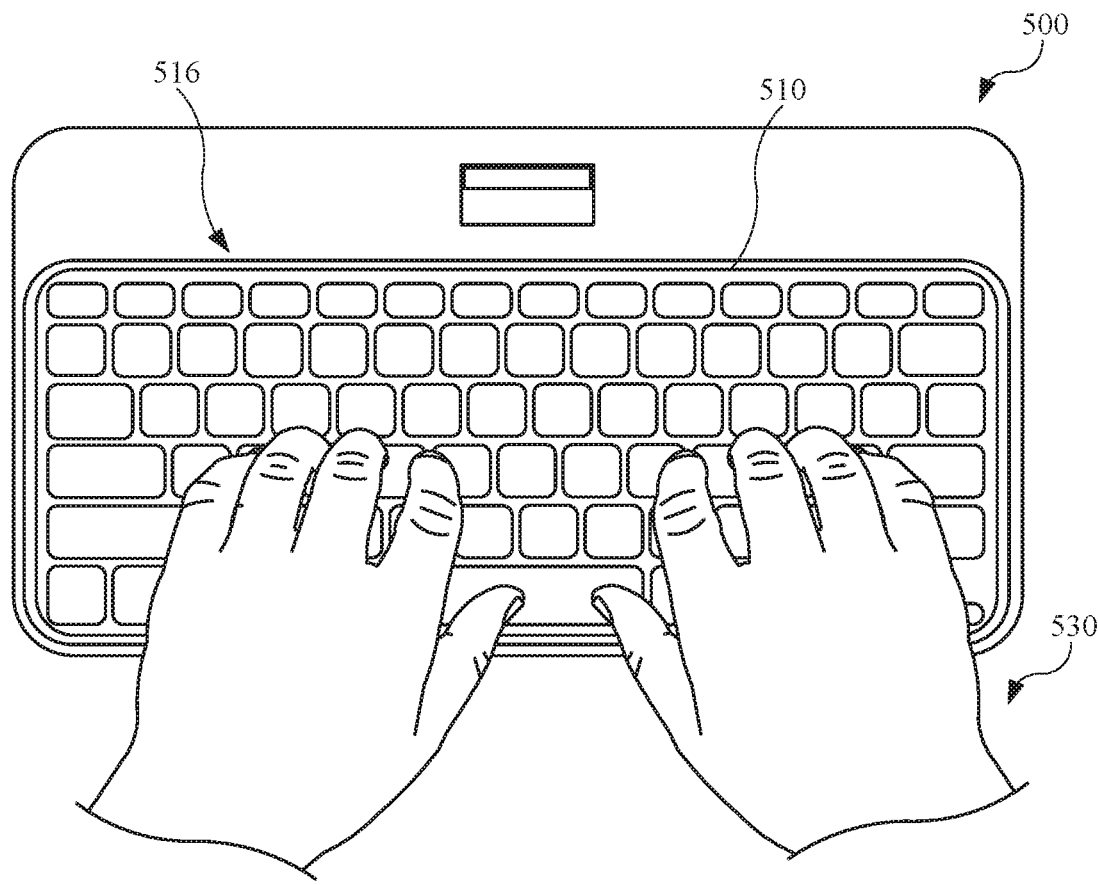
FIG. 18 illustrates a plan view of the accessory device shown in FIG. 17, with the visual information of the display assembly changing to provide an alternate input device based upon a detection of an input to the display assembly by a user.

However, the display assembly 510 may change its visual information based upon a detection of an input by a user. For example, FIG. 18 illustrates a plan view of the accessory device 500 shown in FIG. 17, with the visual information of the display assembly 510 changing to provide an alternate input device based upon a detection of an input to the display assembly 510 by a user 530. As shown, the visual information may take the form of a keyboard 516 displayed on the display assembly 510. The keyboard 516 may be a virtual (non-mechanical) display on the display assembly 510, and having a keyboard having a QWERTY configuration commonly known in the art for a keyboard. In this regard, the keyboard 516, although displayed, may function as a traditional mechanical keyboard. A capacitive touch sensitive layer in the display assembly 510 may perform the input detection. Also, the detection may be a predefined detection or a user-defined detection. Further, the detection may be based on upon the type input received at the display assembly 510. For example, as shown in FIG. 18, the user 530 may present a configuration simulating a typing configuration. Accordingly, when the display assembly 510 detects the typing configuration, the display assembly 510 may change from, for example, a web browser 512 (shown in FIG. 18) to a keyboard 516. Also, the keyboard 516 may be designed to provide an input or command when the accessory device 500 is paired with an electronic device (not shown).

Figure 19:
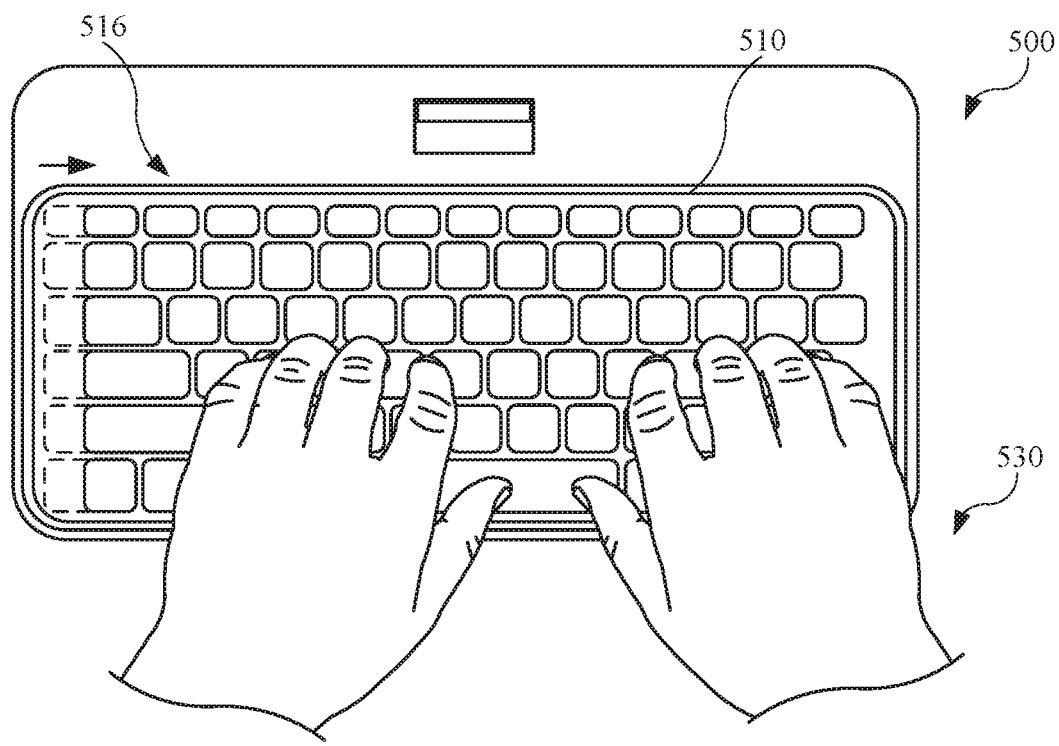
FIG. 19 illustrates a plan view of the accessory device with a display assembly shown in FIG. 18, with the keyboard on the display assembly shifting according to a shift in positioning of the user.

FIG. 19 illustrates a plan view of the accessory device 500 with a display assembly 510 shown in FIG. 18, with the keyboard 516 on the display assembly 510 shifting according to a shift in positioning of the user 530. This may be useful when the accessory device 500 is moving relative to the user 530, during instances such as when the user 530 is sitting in a moving automobile or airplane, and the automobile or the airplane causes the accessory device 500 to move. The display assembly 510 may detect a shift or movement of the user 530, and shift the keys of the keyboard 516 shown on the display assembly 510 to a location below the user 530. In this manner, the user 530 may continue typing in an uninterrupted manner.

Figure 20:
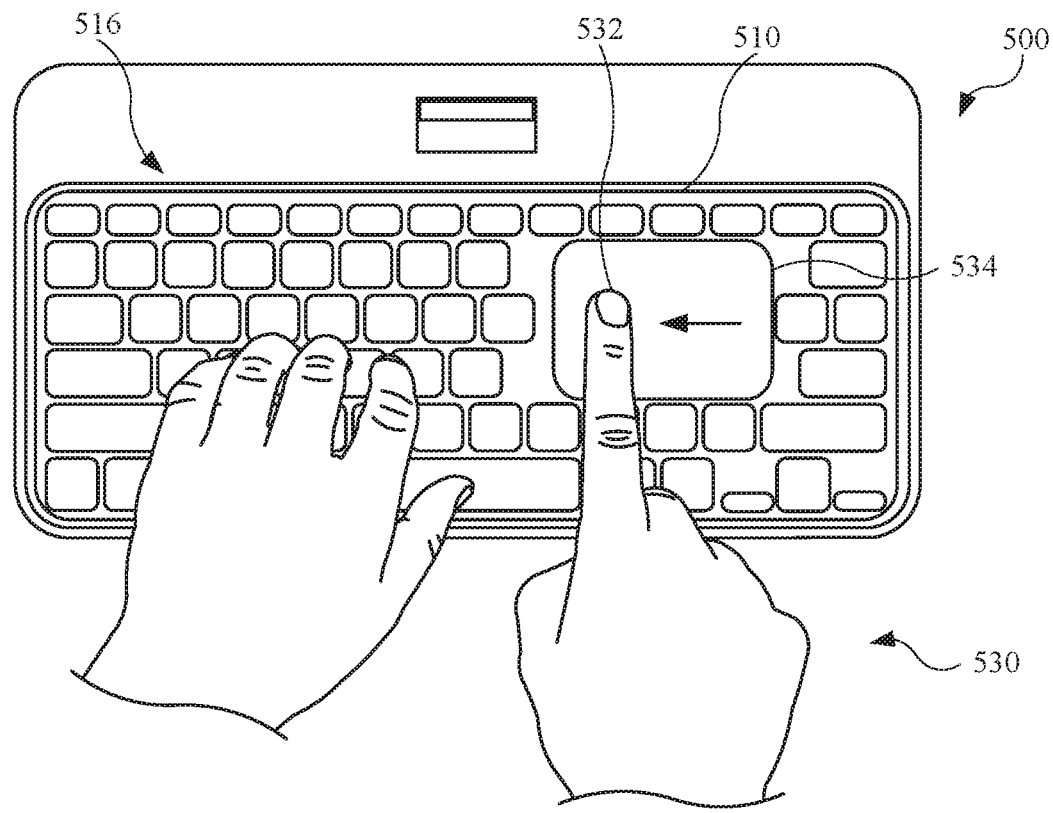
FIG. 20 illustrates a plan view of the accessory device shown in FIG. 19, with the display assembly further changing its visual content to an alternate input device based upon an alternate input detected by the display assembly.

FIG. 20 illustrates a plan view of the accessory device 500 shown in FIG. 19, with the display assembly 510 further changing its visual content to an alternate input device based upon an alternate input detected by the display assembly 510. For example, when the user 530 displays a finger 532 over the display assembly 510, the display assembly 510 may determine the user 530 intends to perform a "swipe" motion commonly found in a physical touch pad of an electronic device. In this manner, the display assembly 510 may remove some of the keys of the keyboard 516 in favor of a touch pad 534 displayed on the display assembly 510. The user 530 may then perform a swipe to the touch pad 534, which may correspond to, as an example, a cursor movement on a display of an electronic device (not shown).

Figure 21:
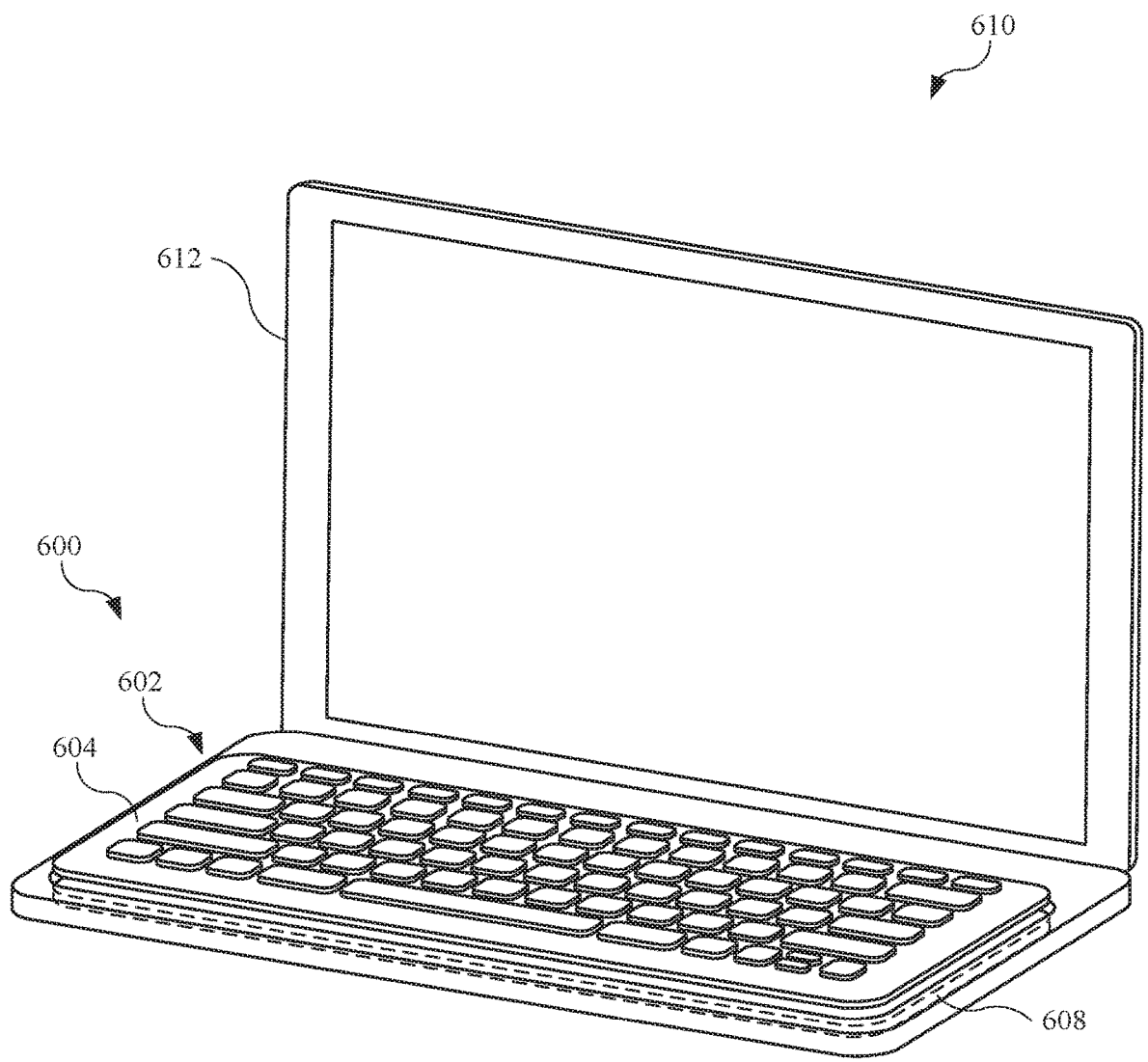
FIG. 21 illustrates an isometric view of an electronic device that includes an accessory device, in accordance with the described embodiments.

The various embodiments of the accessory devices may be paired with an electronic device. Alternatively, at least some embodiments of the accessory devices shown and described may be integrated with an electronic device. For example, FIG. 21 illustrates an isometric view of an electronic device 610, in accordance with the described embodiments. The electronic device 610 may include a laptop computing device. As shown, the electronic device 610 includes a base portion 600 having several features similar to that of an accessory device previously described. The base portion 600 may include first body 604 having a keyboard 602. However, the first body 604 may include any feature previously described for a first body. Further, the base portion 600 is shown in an open configuration. However, by rotating a display housing 612 of the electronic device 610 in a direction toward the base portion 600, a hinge assembly (not shown) may be coupled with a second body 608, causing the first body 604 to move relative to the second body 608. This may cause the base portion 600 to change to a closed configuration, in which the first body 604 magnetically couples with the second body 608 in a manner previously described. Further, an input to the base portion 600 may correspond to a command to the electronic device 610.

Figure 22:
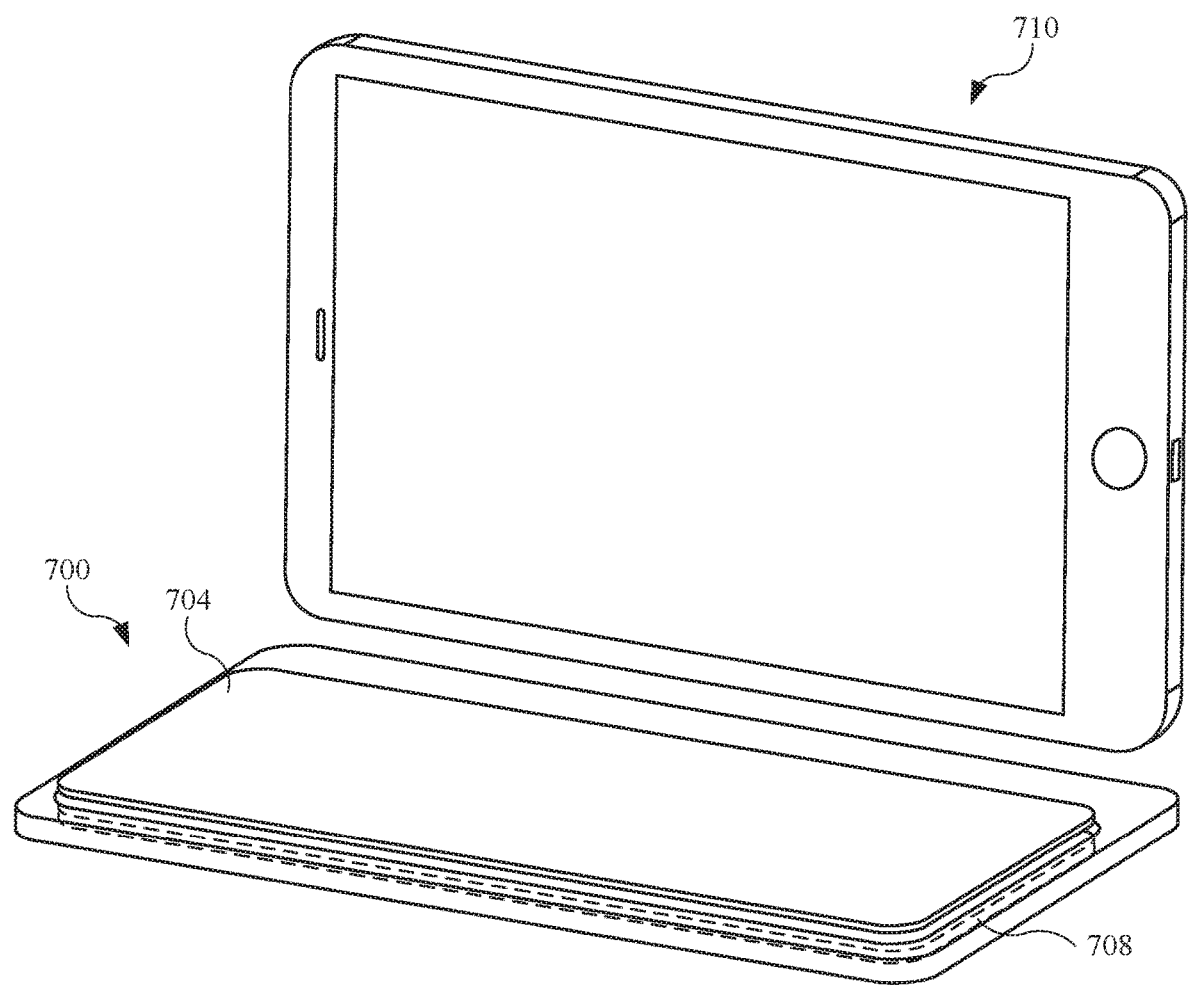
FIG. 22 illustrates an isometric view of an accessory device used in conjunction with an electronic device, in accordance with the described embodiments.

FIG. 22 illustrates an isometric view of an accessory device 700 used in conjunction with an electronic device 710, in accordance with the described embodiments. The electronic device 710 may be a tablet computing device. Also, the accessory device 700 may be paired with the electronic device by a wired communication, or by a wireless communication protocol, such as Bluetooth or 802.11 (Wi-Fi) protocols. As shown, the accessory device 700 includes a first body 704 that includes a fabric layer. However, the first body 704 may include any feature or features previously described for a first body 704. Further, an input to the accessory device 700 may correspond to a command to the electronic device 710. The accessory device 700 may further include a second body 708. As shown, the accessory device 700 is in an opening configuration. However, the accessory device 700 may change to a closed configuration by using a switch (not shown), in which the first body 704 magnetically couples with the second body 708 in a manner previously described.

Figure 23:
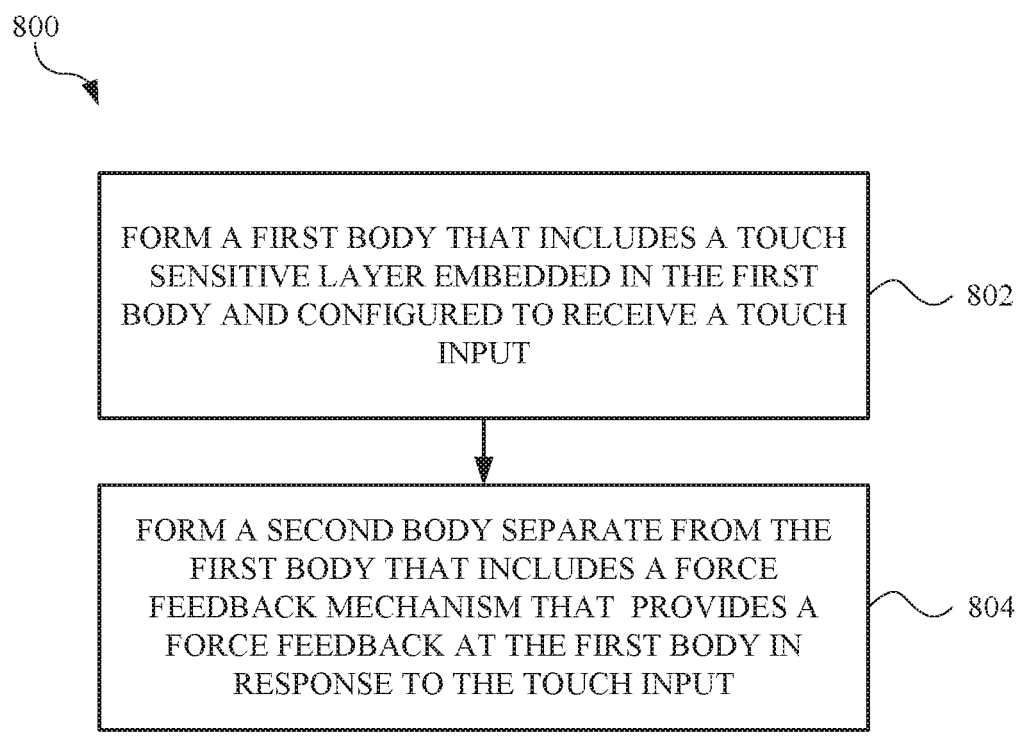
FIG. 23 illustrates a flowchart showing method for assembling an accessory device that provides a force feedback in the accessory device, in accordance with the described embodiments.

FIG. 23 illustrates a flowchart 800 showing a method for assembling an accessory device that provides a force feedback in the accessory device, in accordance with the described embodiments. In step 802, a first body is formed. The first body may include a touch sensitive layer embedded in the first body and configured to receive a touch input. Also, in some embodiments, the first body includes a fabric layer, a keyboard assembly, and/or a display assembly.

In step 804, a second body is formed. The second body is separate from the first body. The second body may include a force feedback mechanism that provides a force feedback at the first body in response to the touch input.

In some embodiments, the force feedback mechanism includes a coil configured to form an external electromagnetic field when the coil receives an electrical current. The external electromagnetic field configured to magnetically couple with one or more magnets in the first body.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An accessory device, comprising:
a substrate having a top surface that surrounds an opening;
a first body in the opening, wherein the first body is configured to receive a touch input, the first body has opposing first and second surfaces, and the first body includes a first magnet; and
a second body disposed in the opening, the second body comprising:
a force feedback mechanism configured to provide a force feedback at the first body in response to the touch input,
a second magnet having a first magnetic polarity, wherein the second magnet is configured to magnetically couple with the first magnet to drive the first body toward the second body and place the first body within the opening with the first surface of the first body coplanar with the top surface of the substrate, and
a third magnet having a second magnetic polarity opposite the first magnetic polarity, wherein the third magnet is configured to magnetically repel the first magnet to drive the first body away from the second body and place the first body at least partially outside the opening with the entire first surface of the first body non-coplanar with the top surface of the substrate.

2. The accessory device of claim 1, wherein the force feedback comprises a vibrational motion of the first body.

3. The accessory device of claim 1, wherein the force feedback mechanism comprises a coil positioned within an opening of the third magnet, the coil configured to receive an electrical current to form an electromagnetic field of the first magnetic polarity to magnetically couple with and attract the first magnet and actuate a portion of the first body having the first magnet in a direction toward the second body.

4. The accessory device of claim 3, wherein the second body comprises a metal positioned within the coil and magnetically coupled to the first magnet when the first magnet magnetically repels the third magnet.

5. The accessory device of claim 1, wherein the second body is actuated perpendicular to the first body in a first direction to align the second magnet with the first magnet, and wherein the second body actuated in a second direction opposite the first direction to align the third magnet with the first magnet.

6. The accessory device of claim 5, wherein the substrate further comprises a switch configured to drive the second body in the first direction and the second direction.

7. The accessory device of claim 1, wherein the first body comprises a display assembly that displays a keyboard used to receive the touch input.

8. The accessory device of claim 1, wherein the second body comprises a coil.

9. The accessory device of claim 1, wherein the first body contacts the second body when the second magnet magnetically couples with the first magnet.

10. An electronic device, comprising:
a housing having an opening;
a first body in the opening, wherein the first body is configured to receive a touch input and wherein the first body includes a first magnet having a first polarity;
a second body in the opening, the second body comprising:
  a second magnet having a second polarity that is opposite the first polarity, wherein the second magnet is configured to magnetically couple with the first magnet and place the first body within the opening;
  a third magnet having a third polarity that is opposite the second polarity, wherein the third magnet is configured to magnetically repel the first magnet to drive the first body at least partially out of the opening and to separate the first body from the second body by a distance, and wherein the third magnet is configured to maintain the distance between at least a portion of the first body and the second body while the first body receives the touch input; and
  a coil positioned within an opening of the third magnet and configured to receive an electrical current to form an electromagnetic field of the first polarity.

* * * * *